United States Patent
Zhang et al.

(10) Patent No.: US 11,469,088 B2
(45) Date of Patent: Oct. 11, 2022

(54) METHODS AND APPARATUS OF ADAPTIVE AND AUTOMATIC ADJUSTING AND CONTROLLING FOR OPTIMIZED ELECTROMETER ANALOG SIGNAL LINEARITY, SENSITIVITY, AND RANGE

(71) Applicant: Thermo Finnigan LLC, San Jose, CA (US)

(72) Inventors: Hongxuan Zhang, Austin, TX (US); Scott T. Quarmby, Round Rock, TX (US)

(73) Assignee: THERMO FINNIGAN LLC, San Jose, CA (US)

( * ) Notice: Subject to any disclaimer, the term of this patent is extended or adjusted under 35 U.S.C. 154(b) by 0 days.

(21) Appl. No.: 17/074,527

(22) Filed: Oct. 19, 2020

(65) Prior Publication Data

US 2022/0122827 A1    Apr. 21, 2022

(51) Int. Cl.
*H01J 49/02* (2006.01)
*H01J 49/00* (2006.01)
*H03F 1/32* (2006.01)

(52) U.S. Cl.
CPC ........ *H01J 49/022* (2013.01); *H01J 49/0027* (2013.01); *H03F 1/32* (2013.01); *H03F 2200/375* (2013.01)

(58) Field of Classification Search
CPC ....... H01J 49/022; H01J 49/0027; H03F 1/32; H03F 2200/375
See application file for complete search history.

(56) References Cited

U.S. PATENT DOCUMENTS

| | | |
|---|---|---|
| 3,510,647 A | 5/1970 | Wood |
| 3,823,315 A | 7/1974 | Mosharrafa |
| 3,920,986 A | 11/1975 | Fies, Jr. |
| 3,946,229 A | 3/1976 | Moseman, Jr. |
| 3,997,779 A | 12/1976 | Rabl |
| 4,691,160 A | 9/1987 | Ino |
| 4,851,673 A | 7/1989 | Izumi et al. |
| 4,982,191 A | 1/1991 | Ohta |

(Continued)

FOREIGN PATENT DOCUMENTS

WO    2017135815 A1    8/2017

OTHER PUBLICATIONS

Beavis, "Increasing the dynamic range of a transient recorder by using two analog-to-digital converters", J Am Soc Mass Spectrom 1996 (7), pp. 107-113.

(Continued)

*Primary Examiner* — Nicole M Ippolito
*Assistant Examiner* — Hanway Chang (57) ABSTRACT

A signal processing assembly for a detector includes a signal amplifier, a control unit, and an offset control module. The signal amplifier is configured to receive an input signal from the detector assembly and to provide an output signal. The control unit is configured to compare a first data point from the output signal with a signal range, and to generate an input bias control signal based upon the comparison. The offset control module is coupled with the control unit and configured to receive the input bias control signal. The offset control module includes a power supply operatively coupled with an input of the signal amplifier, and the offset control module is configured to generate and apply an adaptive input offset signal at the input of the signal amplifier based upon the input bias control signal.

20 Claims, 8 Drawing Sheets

(56) References Cited

U.S. PATENT DOCUMENTS

| | | |
|---|---|---|
| 5,463,219 A | 10/1995 | Buckley et al. |
| 5,777,326 A | 7/1998 | Rockwood et al. |
| 5,926,124 A | 7/1999 | Shimomura |
| 6,229,142 B1 | 5/2001 | Bateman et al. |
| 6,373,067 B1 | 4/2002 | Shimomura |
| 6,740,068 B1 | 5/2004 | Aruffo et al. |
| 7,047,144 B2 | 5/2006 | Steiner |
| 7,109,463 B2 | 9/2006 | Milshtein et al. |
| 7,238,936 B2 | 7/2007 | Okamura et al. |
| 7,256,393 B2 | 8/2007 | Keller et al. |
| 7,745,781 B2 | 6/2010 | Steiner |
| 8,519,327 B2 | 8/2013 | Izumi |
| 8,637,811 B2 | 1/2014 | Steiner et al. |
| 8,700,346 B2 | 4/2014 | Jourdan |
| 9,024,618 B2 | 5/2015 | McCormick |
| 9,052,287 B2 | 6/2015 | Tinsley |
| 9,269,552 B2 | 2/2016 | Steiner et al. |
| 9,396,914 B2 | 7/2016 | Steiner et al. |
| 9,625,417 B2 | 4/2017 | Steiner et al. |
| 10,395,905 B2 | 8/2019 | Steiner et al. |
| 10,468,239 B1 | 11/2019 | Steiner et al. |
| 2020/0319147 A1 | 10/2020 | Sawata |

OTHER PUBLICATIONS

Kristo, et al., "System for simultaneous count-current measurement with dual-mode photon/particle detector", Review of Scientific Instruments 1988, 59, pp. 438-422.

Romele et al., "Multiscale real time and high sensitivity ion detection with complementary organic electrochemical transistors amplifier", Nature Communications 11, 3743 (2020). https://doi.org/10.1038/s41467-020-17547-0.

Schoen et al., "A hybrid BEQQ mass spectrometer", International Journal of Mass Spectrometry and Ion Processes 1985, vol. 65 (1-2), pp. 125-140.

Spieler, "Analog and Digital Electronics for Detectors", Physics Division, Lawrence Berkely National Laboratory, Proceedings of the 2003 ICFA School of Instrumentation, Itacuruca Brazil, (2003), 43 pages. Downloaded from the internet: https://www.desy.de/~garutti/LECTURES/ParticleDetectorSS12/spieler.pdf.

| INPUT SIGNAL (μA) | | INPUT OFFSET (μA) | What ADC Sees (μA) | | Allowable Actual Input Signal (μA) | | What ADC Could See (μA) | |
|---|---|---|---|---|---|---|---|---|
| Min | Max | | Min | Max | Min | Max | Min | Max |
| 0 | -8 | 0 | 0 | -8 | 0 | -10 | 0 | -10 |
| -8 | -14 | 6 | -2 | -8 | -6 | -16 | 0 | -10 |
| -14 | -20 | 12 | -2 | -8 | -12 | -22 | 0 | -10 |
| -20 | -26 | 18 | -2 | -8 | -18 | -28 | 0 | -10 |
| -26 | -32 | 24 | -2 | -8 | -24 | -34 | 0 | -10 |
| -32 | -38 | 30 | -2 | -8 | -30 | -40 | 0 | -10 |
| -38 | -44 | 36 | -2 | -8 | -36 | -46 | 0 | -10 |
| -44 | -50 | 42 | -2 | -8 | -42 | -52 | 0 | -10 |
| -50 | -56 | 48 | -2 | -8 | -48 | -58 | 0 | -10 |
| -56 | -62 | 54 | -2 | -8 | -54 | -64 | 0 | -10 |
| -62 | -68 | 60 | -2 | -8 | -60 | -70 | 0 | -10 |
| -68 | -74 | 66 | -2 | -8 | -66 | -76 | 0 | -10 |
| -74 | -80 | 72 | -2 | -8 | -72 | -82 | 0 | -10 |
| -80 | -86 | 78 | -2 | -8 | -78 | -88 | 0 | -10 |
| -86 | -92 | 84 | -2 | -8 | -84 | -94 | 0 | -10 |
| -92 | -98 | 90 | -2 | -8 | -90 | -100 | 0 | -10 |
| -98 | -104 | 96 | -2 | -8 | -96 | -106 | 0 | -10 |
| -104 | -110 | 102 | -2 | -8 | -102 | -112 | 0 | -10 |
| -110 | -116 | 108 | -2 | -8 | -108 | -118 | 0 | -10 |
| -116 | -122 | 114 | -2 | -8 | -114 | -124 | 0 | -10 |
| -122 | -128 | 120 | -2 | -8 | -120 | -130 | 0 | -10 |
| -128 | -134 | 126 | -2 | -8 | -126 | -136 | 0 | -10 |
| -134 | -140 | 132 | -2 | -8 | -132 | -142 | 0 | -10 |

METHODS AND APPARATUS OF ADAPTIVE AND AUTOMATIC ADJUSTING AND CONTROLLING FOR OPTIMIZED ELECTROMETER ANALOG SIGNAL LINEARITY, SENSITIVITY, AND RANGE

TECHNICAL FIELD

The present disclosure is directed generally to the detection of ions by means of ion-to-current conversion, which finds use, for example, in fields of analytical chemistry such as mass spectrometry. More particularly, the present invention relates to a measurement apparatus or sample analyzer such as a gas chromatograph-mass spectrometer (GC-MS) or liquid chromatograph-mass spectrometer (LC-MS), especially to those parts relating to converting an analog signal from the measurement apparatus into digital data.

BACKGROUND

The linear dynamic range of mass spectrometers can often be limited by the ion detection system. Ion sources are now intense enough that the number of ions delivered to the detector is large enough to saturate the detection system. This issue, in some respects, is more critical in ion trap instruments, which attempt to regulate the exact number of ions contained in the trap using a pre-scan measurement technique. In this case, any saturation effect of the detector would result in substantial space charge effects in the desired mass spectrum. Consider for example, the analytical scan for which a pre-scan experiment is performed prior to the analytical scan in order to obtain a measurement of the flux of the ion beam. The measurement can then be used to determine the ion accumulation time used for the analytical scan. However, by using a fixed pre-scan ion accumulation time, there is a possibility that one or more of the peaks in the pre-scan will saturate the detector electronics if the ion current from the source is high. Under these conditions, the measured total ion current (TIC) will be less than the actual TIC. Use of this low TIC results in the calculation of an ion accumulation time for the subsequent analytical scan which is erroneously high, causing possible space charge to occur and therefore an overall reduction in performance in the mass spectrometer.

In the case of a typical LC quadrupole ion trap mass spectrometer, as the atmospheric pressure ionization (API) source has become more efficient, the normal pre-scan ion accumulation time of 10 milliseconds (ms) can cause the electrometer to be saturated by the current produced by the electron multiplier. The saturation is even more likely to occur during the pre-scan measurement primarily because of the higher scan rate (0.015 ms/amu which is 12 times the analytical scan rate) ejects ions faster, resulting in narrower, taller peaks.

Again, in the case of an ion trap mass spectrometer, the result is that the ion trap can be overfilled for the subsequent analytical scan, resulting in reduced performance.

For linear ion traps, the saturation problem is more severe for several reasons. First, a linear trap fundamentally can hold more ions (has a higher dynamic range) and therefore will deliver more ions to the detector. Second, the linear ion trap can be operated with two detectors, which then doubles the detected current. Third, the higher resolution of the current linear ion traps allows for even higher scan rates during the prescan (20-50 times the analytical scan rate) and higher scan rates produce higher detected currents (narrower but taller).

In some instances, the dynamic range limitation of the detection system can be caused by the saturation of the analog to digital conversion component (ADC). For example, a 16-bit analog to digital conversion (ADC) is limited to a maximum of 4.8 orders of magnitude (log $2^{16}$). This is because a 16-bit ADC has a range of possible digital output values from 0 to 65535 counts. When using such a component, one must typically adjust the gain of the detector, or that of the amplifier between the detector and the ADC input so that a single ion pulse amplitude produces a signal at the ADC input that corresponds to several digital counts. This is so that most of the single ion pulse amplitudes are large enough to register at least one bit on the digital counter. Otherwise, the single ions that produce output pulses with amplitudes that fall below that threshold will not be recorded, resulting in an error in the intensities measured. So, in practice, a 16-bit ADC has less than 4.8 orders of magnitude of dynamic range. Typically, the effective dynamic range would be about 3.9 orders of magnitude.

There is a need to develop detection and measurement systems that are able to operate over a high dynamic range, able to detect and measure particles over a wide range of intensities, from weak to strong intensities without suffering from saturation or an overly low detection threshold in the noise band. Furthermore, there is a need for a detection and measurement system that is capable of operating in real-time, enabling high speed operation to be facilitated whilst once again, operating under conditions such that saturation or low detection threshold levels are not an issue. Methods and apparatuses providing a simpler method of increasing the dynamic range while maintaining adequate resolution are required.

BRIEF SUMMARY

The disclosure is directed to a novel method and apparatus which provides real time control of the electrometer gain and the conditioning of a detected analog signal. Features of the novel methods and apparatuses disclosed herein can provide a faster and more reliable electrometer with high linearity, high sensitivity, and larger input signal range. In some versions, the method and apparatus can additionally compensate for error and noise detected from the environment and system.

A signal amplifier can be configured to receive an input signal from the detector assembly and can provide an output signal. In some versions, a control unit can be configured to compare a first data point from the output signal with a signal range, and the control unit can generate an input bias control signal or command based upon the comparison. Further, an offset control module can be coupled with the control unit and configured to receive the input bias control signal. The offset control module can in some versions include a power supply operatively coupled with an input of the signal amplifier, and the offset control module can be configured to generate and apply an adaptive input offset signal at the input of the signal amplifier based upon the input bias control signal.

The foregoing has outlined rather broadly the features and technical advantages of the present disclosure in order that the detailed description that follows may be better understood. Additional features and advantages will be described hereinafter which form the subject of the claims. It should be appreciated by those skilled in the art that the conception and specific embodiment disclosed may be readily utilized as a basis for modifying or designing other structures for carrying out the same purposes. It should also be realized by those skilled in the art that such equivalent constructions do not depart from the spirit and scope of the disclosure as set forth in the appended claims. The novel features which are believed to be characteristic of the disclosed systems and methods, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

In the description herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. Moreover, it is to be appreciated that the figures, as shown herein, are not necessarily drawn to scale, wherein some of the elements may be drawn merely for clarity of the disclosure. Also, reference numerals may be repeated among the various figures to show corresponding or analogous elements. Additionally, it will be understood that any list of such candidates or alternatives is merely illustrative, not limiting, unless implicitly or explicitly understood or stated otherwise. In addition, unless otherwise indicated, numbers expressing quantities of ingredients, constituents, reaction conditions and so forth used in the specification and claims are to be understood as being modified by the term "about."

Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

Numerous types of detector arrangements exist for the measurement of particles such as ions, electrons, photons, and neutral particles. Although the invention will be described in terms of the detection of ions in mass spectrometry applications, it can be extended to apply to the detection of many other types of particles in many other applications. For example, the detection of photons for spectroscopy.

Figure 1:
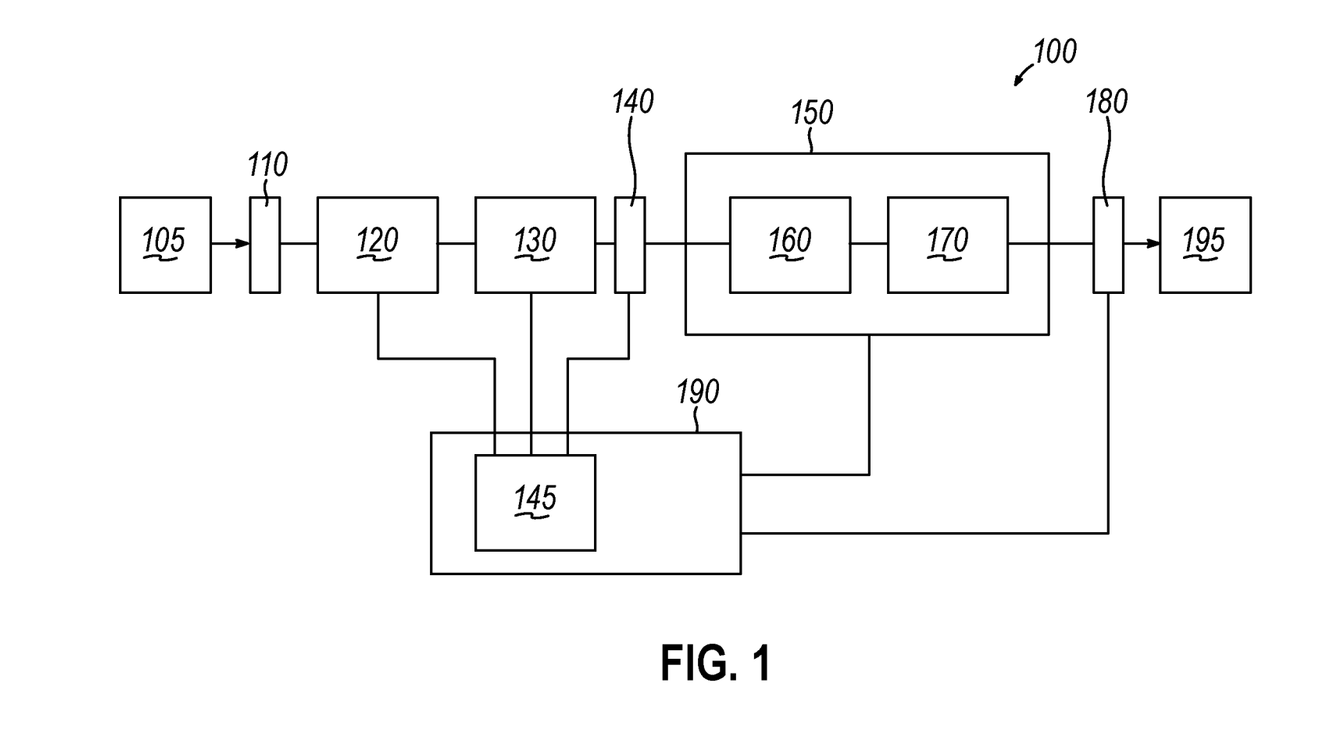
FIG. 1 depicts a schematic representation of a prior art mass spectrometer detection arrangement.

Referring now to the drawings, FIG. 1 is a schematic representation of one form of prior art mass spectrometer detector assembly 100.

The detector assembly 100 receives ions 105 which emanate from an ion source (not shown) as either a beam of ions (continuous or non-continuous) or in pulses. The ions 105 generated are either of or from a substance to be analyzed. The ions 105 may be directed by conventional ion optics and/or mass separation techniques 110 to the detection system.

Ion detection systems generally comprise an ion converting element 120 (for example a conversion dynode) followed by an electron multiplying element 130 (such as a continuous-dynode electron multiplier). In some implementations, the ions directly impinge the surface of the electron multiplying element 130, and consequently no ion-electron converting element 120 is required (such as in the case of a microchannel plate). A current measuring device 140, such as an anode which may be combined with a pre-amplifier, is disposed to receive the particles produced by the electron multiplying element 130. A converting means 150 is provided to respond to the current flow generated in the current measuring device 140 to ultimately produce an output signal 195. The converting means can, in some versions, consist of an amplifier 160 and an ADC (Analog-to-Digital Converter) 170, for example. The ADC 170 generates a series of digital signals representative of the input, sometimes amplified, signal. When passed to a digital signal processor 180, a representation of the intensity of the original ion beam spectrum can be attained. Some or all of the components of system 100 can in some versions be coupled to a system control unit, such as an appropriately programmed digital computer 190, which receives and processes data from the various components and which can be configured to perform detection analysis on the data received. Optionally, digital computer 190 may include an analog processing unit 145 coupled with the current measuring device 140 enabling the analog signal derived therefrom to be analyzed.

Typically, in order to obtain more meaningful results from an ion trapping type of mass spectrometer, the issue of the space charge conditions in the analysis cell of the mass spectrometer is addressed, conventionally by using AGC (automatic gain control), a method by which the total charge in the analysis cell of the mass spectrometer is maintained at a constant level, generally an optimum level for all analytical scans.

Conventionally, AGC methods often require that pre-scan experiments or prior analytical scan experiments be performed so that a measurement of the current flux of ions can be ascertained and an adjustment of the ionization parameters can be made to achieve the optimum level of charge in the analytical scan. Generally, these pre-scans or prior analytical experiments are carried out using the same detector settings as the actual analytical experiment, and the control of the ion population is provided through adjustment of the ion accumulation time.

When the ADC at the output of the ion detector has insufficient dynamic range, several methods can be used to improve it. First, existing methods of increasing this range have included multi-anode electron multipliers. Here, different percentages of the ion signal are collected on different anodes, and one anode collects a larger percentage of the ion signal than the other. Multiple electrometers are used to measure these currents. The electrometer with the best measurement is then used. However, it can be difficult to keep the relative gain between these channels constant, as the ion signal beam changes shape and size and does not consistently split between the multiple anodes. Further, the systems are more complex because they require two, or more, ADCs.

Second, non-linear amplifiers can be used. With these, the gain changes as a function of the input signal. For example, if the output of the amplifier is the input A where 0<A<1, then the input signal range will be compressed into a narrower output signal range. This allows a wider input signal range to fit within the dynamic range of the ADC. However, resolution is reduced. This makes the quantization error worse across the entire input signal range compared to linear amplifiers where A=1. On the other hand, logarithmic amplifiers can be used where the output is B*log(input)+C where B and C are constants. With proper choice of B and C, the quantization error at low input signals is actually improved compared to linear amplifiers. However, the quantization error will be worse at high input signals compared to linear amplifiers. Unfortunately, logarithmic amplifiers often have low bandwidth, which adversely affects dynamic range. They also have poor temperature stability making them complicated and expensive to produce.

Figure 2:
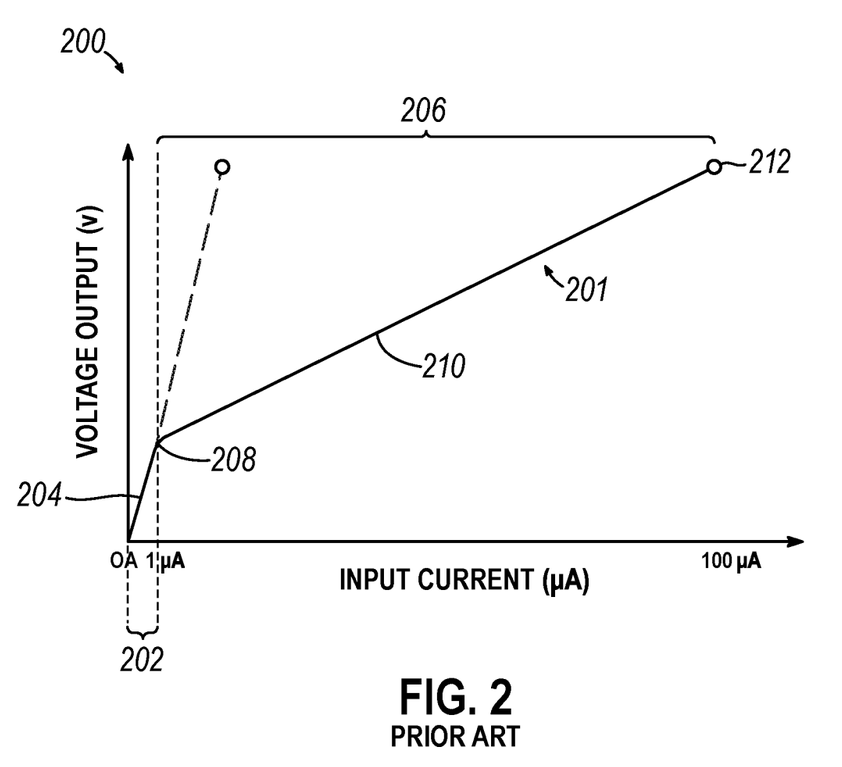
FIG. 2 depicts a graphical representation of a prior art electrometer signal acquisition curve.

Third, ion detection systems have been used that switch the gain of the signal based on the input signal. For example, the gain of the analog amplifier can be adjusted. These systems typically have two or more gain stages that can be selected from. FIG. 2 illustrates an example output graph 200 of an ADC output 201 using such a method. As the input current is detected within a first range 202, such as between 0 amps and 1 microamp, a first gain setting is applied to the input signal, illustrated by slope 204 of ADC output 201. As the input current signal increases above the first range 202, the ADC output 201 signal becomes saturated and cannot remain within the linear dynamic range of the electrometer. As such, gain is adjusted to the second range 206, such as by rerouting gain resistors of the amplifier or adjusting diodes in front-end circuitry. Particularly, the gain and sensitivity are decreased to bring the ADC output 201 within the linear dynamic range of electrometer thereby resulting in an inflection point 208 in the ADC output 201. Thereafter, while the input current remains within the second range and until it reaches the full range 212 of the electrometer, the second gain setting is applied, illustrated by slope 210 of ADC output 201. Therefore, by adjusting the gain and sensitivity between one or more stages, ADC output 201 remains within the linear dynamic range of the electrometer, while signal linearity, resolution, and noise contamination are diminished. With regard to resolution, when compared to the first gain stage 204, a larger change in the input current of the second gain stage 210 only results in a smaller change in the ADC output 201, thereby diminishing the resolution. Additional problems with this method are also encountered as input signals can change rapidly, resulting in the gain switching circuit not being capable of acting fast enough to keep up. Finally, such systems are typically expensive and complicated to produce.

Figure 3:
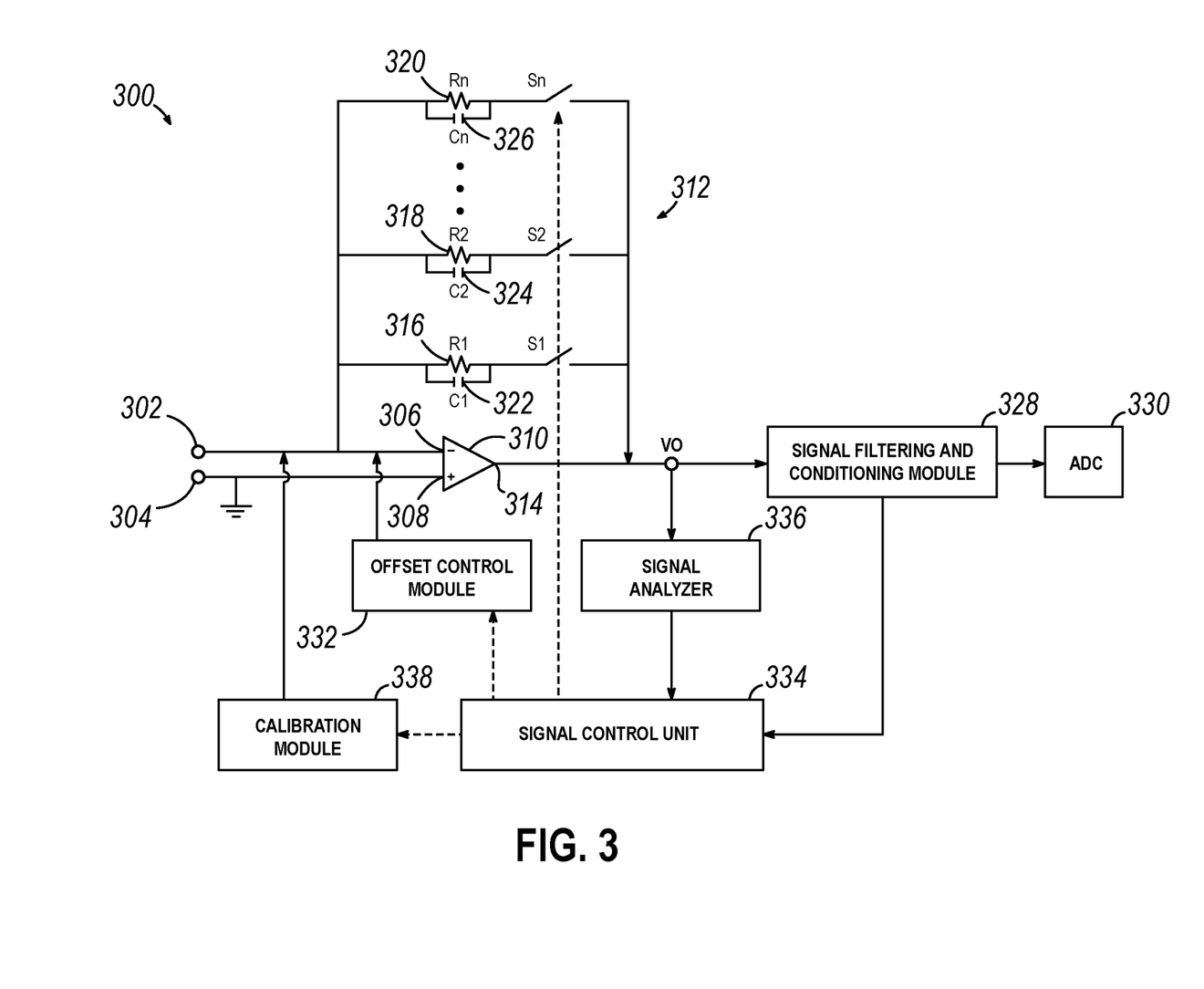
FIG. 3 depicts a schematic representation of one exemplary signal processing assembly for use with a mass spectrometer detection arrangement.

FIG. 3 illustrates one example of an improved signal processing assembly 300, which may serve wholly or partially in place of current measuring device 140 for coupling with ion detector. Particularly, signal processing assembly 300 may couple with ion converting element 120 and/or electron multiplying element 130 as described herein. Signal processing assembly 300 is configured to accept a current input at node 302, while node 304 may be coupled with an electrical ground or another voltage reference source. Nodes 302, 304 are configured to couple with the inverting and non-inverting inputs 306, 308, respectively, of an amplifier 310. In the illustrated example, amplifier 310 is configured to convert the current input to an output voltage V0, and provide the output voltage V0 through an optional voltage signal conditioning and filtering module 328 before feeding it into an ADC 330. Amplification assembly 312 may also be included and operable as a variable feedback resistor or RC circuit assembly to permit amplification adjustments of the current-to-voltage conversion. As such, amplification assembly 312 is electrically coupled between inverting input 306 of amplifier 310 and the output 314 of amplifier 310, and may include one or more resistors 316, 318, 320 and capacitors 322, 324, 326 as required to appropriately amplify signals to meet the signal range requirements of ADC 330.

As described above with reference to FIG. 2, adjusting the gain of amplification assembly 312 to ensure the amplified signals meet the signal range requirements of ADC 330 can in some instances result in diminished signal linearity and resolution. In some ion detection systems, the input current may range from approximately 1 picoamp to approximately 10 milliamps, and in other systems from approximately 100 picoamp to 1 milliamp. To address this problem, the input offset of amplifier 310 can be adjusted in real-time to more closely match the input current received from the detector. More specifically, the input offset provided at amplifier 310 can be adjusted to increase or decrease consistently with the current that is being detected to effectively float the "zero" at the amplifier 310 input. This allows for a virtually infinitely large input current range to be detected, as the input current may be offset as much as required. For example, as a higher input current is provided to node 302 of amplifier 310 relative to node 304, the input offset at non-inverting node 308 may be increased. Similarly, as a lower input current is provided to node 302 of amplifier 310 relative to node 304, the input offset at non-inverting node 308 may be decreased. By doing so, the input offset may be selectively operable to ensure the input current to amplifier 310 remains at a manageable level, such as, within the dynamic range of amplifier 310 and ADC 330. To perform this task, signal processing assembly 300 can include an offset control module 332, a signal control unit 334, a signal analyzer 336, and optionally a calibration module 338, each of which may include one or more data processors configured to perform the tasks described herein. In some versions, signal analyzer 336 may be included as part of, or otherwise functionally combined with signal control unit 334.

In operation, signal analyzer 336 is coupled with output 314 of amplifier 310 and configured to receive and analyze output voltage V0. Signal analyzer 336 may be configured to measure, for example, peak-to-peak voltage, RMS, or other signal characteristics, and to provide such analysis to signal control unit 334. Signal analyzer 336 may be configured to sample output voltage V0 at frequency ranges from approximately 100 Hz to approximately 10 GHz. In some versions, which may depend on the type of mass spectrometer and therefore the characteristics of the input signal received by amplifier 310 from the detector, signal analyzer 336 may be configured to sample output voltage V0 at frequency ranges between approximately 100 kHz and 1 MHz.

Signal control unit 334 is configured to receive the analysis from signal analyzer 336 and selectively operate and adjust offset control module 332 in real time, for example, sampling and adjusting within time periods of less than 1 microsecond, or in some versions, in less than 0.1 microseconds. Particularly, signal control unit 334 may determine that the input current received by amplifier 310, or output voltage V0, has increased or decreased toward an outer edge of a preferred, pre-determined dynamic range of amplifier 310 and/or ADC 330, and direct offset control module 332 (e.g., by sending a command to offset control module 332) to increase or decrease the input offset current to amplifier 310. For example, if amplifier 310 and ADC 330 most effectively operate within a dynamic range of 1 picoamp to 1 microamp, signal control unit 334 may be configured to generate and transmit a command to increase the input offset current at amplifier 310 as the input current signal surpasses 0.5 microamps to insure voltage output V0 remains relatively centered within this preferred dynamic range. This provides a buffer insuring that future input current variations remain within the dynamic range. Thereafter, signal control offset 334 may continue increasing or decreasing the input offset current as it detects input current variations, the input offset current adjustments being based upon predetermined input current or output voltage V0 thresholds.

In some versions, signal control unit 334 may be configured to review the last several samplings as provided by signal analyzer 336 to adaptively predict an approximate magnitude of future input current signal samplings, and further to proactively adjust the input offset current to amplifier 310. Signal control unit 334 may be configured to apply one of any number of techniques to provide this prediction, such as by using a derivative, a spline interpolation, a linear extrapolation, a non-linear extrapolation, a low-pass digital filter, or any other suitable data processing technique. For example, the true input current for the last two time points could be linearly fit to the equation Input Current=m*Time+b. After solving for the slope, m, and the intercept, b, this equation could be used to estimate the input current at a time in the future. The input offset current can then be adjusted so that at that time in the future an appropriate output voltage V0 will occur. Additional points can be used for more complex extrapolations, including spline interpolations or non-linear extrapolations.

If the offset control device has enough dynamic range, a gain adjustment would not be required. However, in some versions, configured for circumstances where it may not be practical to have a large dynamic range for the offset signal, control unit 334 may optionally be configured to simultaneously adjust the amplification provided to the input current signal by amplification assembly 312. For example, the amplification could be varied by selectively adjusting the feedback RC circuitry of amplification assembly 312. In such a case, the adjustable gain would be accounted for during the calibration process.

Offset control module 332 includes a current source and is configured to electrically couple with the inverting node 306 of amplifier 310. In one version, offset control module 332 is comprised of a voltage supply, fixed or variable, that is coupled with one or more resistors. By adjusting the voltage or selectively adjusting the resistance of the one or more resistors, via the signal control unit 334, the current can be modified and provided to node 306 of amplifier 310 to offset the input signal provided at node 306 of amplifier. In other examples, other types of variable resistances such as diodes or transistors may be utilized.

Figure 4:
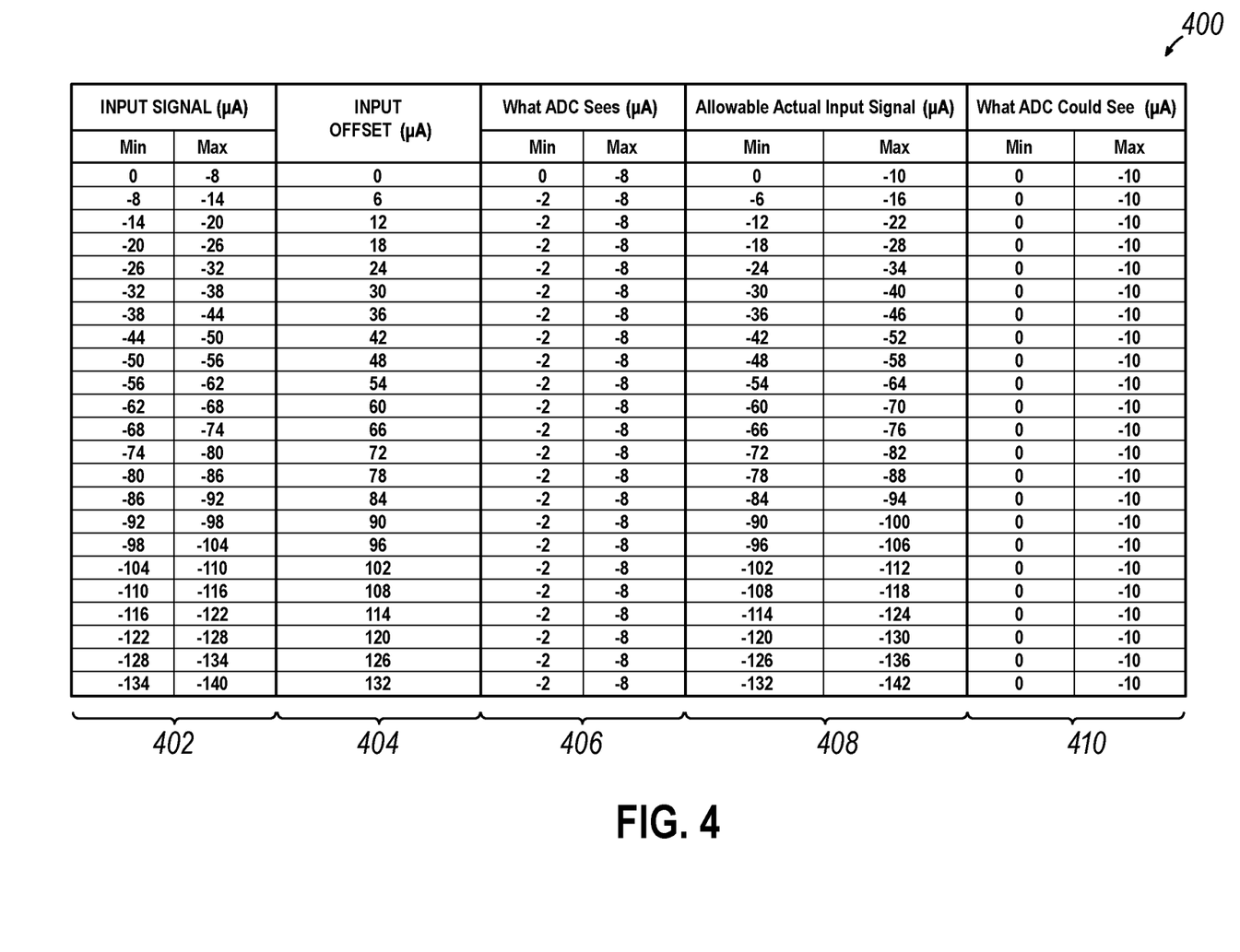
FIG. 4 depicts a table of electrometer signal outputs generated by the signal processing assembly of FIG. 3 in response to various input signal ranges.

FIG. 4 is a table showing one example of electrometer signal inputs and outputs 400 received and generated by the signal processing assembly 300 while employing the adaptive range control concepts described above. The first column set 402 illustrates a range of input signals which may be received at an input node of signal processing assembly 300, such as node 302. The second column set 404 illustrates corresponding offset signals generated for each respective input signal range of first column set 402 by offset control module 332 of signal processing assembly 300. Once the offset signal is applied by offset control module 332, output V0 is affected to bring the input to ADC 330 within a particular range, as is shown in third column set 406. As such, the allowable input signal to signal processing assembly 300, as shown in fourth column set 408, is able to vary greatly and permits input current levels which would generally be out of range of ADC 330. Also as shown in first and fourth column sets 402, 408, respectively, is an approximately 2 microamp margin built into each end of the range which serves to limit errors in the event the future input current experiences a larger than anticipated move (see, particularly, the ranges of fourth column set 408 provide a 2 microamp margin below the low end of the input current range and a 2 microamp margin above the high end of the input range relative to the input currents shown in first column set 402). Finally, fifth column set 410 illustrates the final input signal as received by ADC 330, illustration how ADC 330 may experience the same or similar linearity and sensitivity with a low input current as it would with a high input current received from node 302. Importantly, using this method, virtually any magnitude of input current above the lowest end dynamic range of the amplifier 310 and/or ADC 330 may be detected as the input offset current may effectively be increased as much as required to bring the input current signal back within dynamic range.

Figure 5:
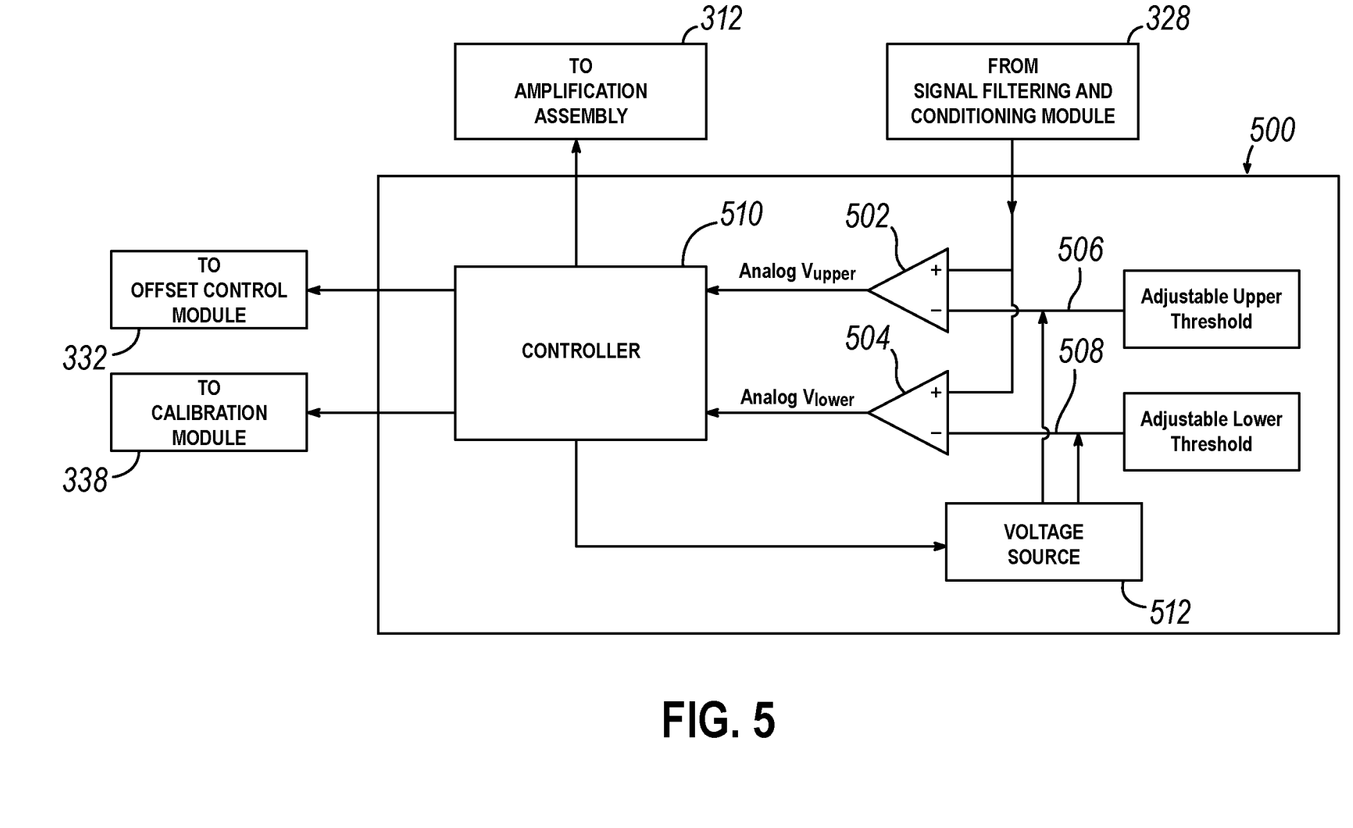
FIG. 5 depicts a schematic representation of one exemplary signal control unit for use with the signal processing assembly of FIG. 3, the signal control unit configured for analog voltage output feedback.

FIG. 5 illustrates an example of a signal control unit 500, which may be utilized and operable to provide the functions of signal control unit 334 as described above. Specifically, signal control unit 500 provides as one example analog-based module for controlling one or more of amplification assembly 312, offset control module 332, and calibration module 338. Signal control unit 500 includes first and second comparators 502, 504 configured to each receive output voltage V0 and a reference voltage. Specifically, comparator 502 is configured to compare output voltage V0 with an upper range voltage reference signal 506, such as a selectively adjustable reference voltage signal, and provide the HIGH or LOW output to a controller 510. For example, upper range voltage reference signal may range from approximately 1 volt to 150 volt, or in other examples may range from approximately 5 volt to 36 volt, or still in other examples may range from approximately 9 volt to 12 volt. Similarly, comparator 504 is configured to compare output voltage V0 with a lower range voltage reference signal 508, such as a selectively adjustable reference voltage signal, and provide the HIGH or LOW output to a controller 510. For example, lower range voltage reference signal 508 may range from approximately 10 microvolts to 1 volt. As such, controller 510 is able to determine whether output voltage V0 is within a predetermined input current signal range threshold. Thereafter, controller 510 may selectively control one or more of amplification assembly 312, offset control module 332, and calibration module 338 as described herein. As such, controller 510 can include a field-programmable gate array, a central microcontroller module or the like, along with an ADC and adaptive switching control capabilities.

Figure 6:
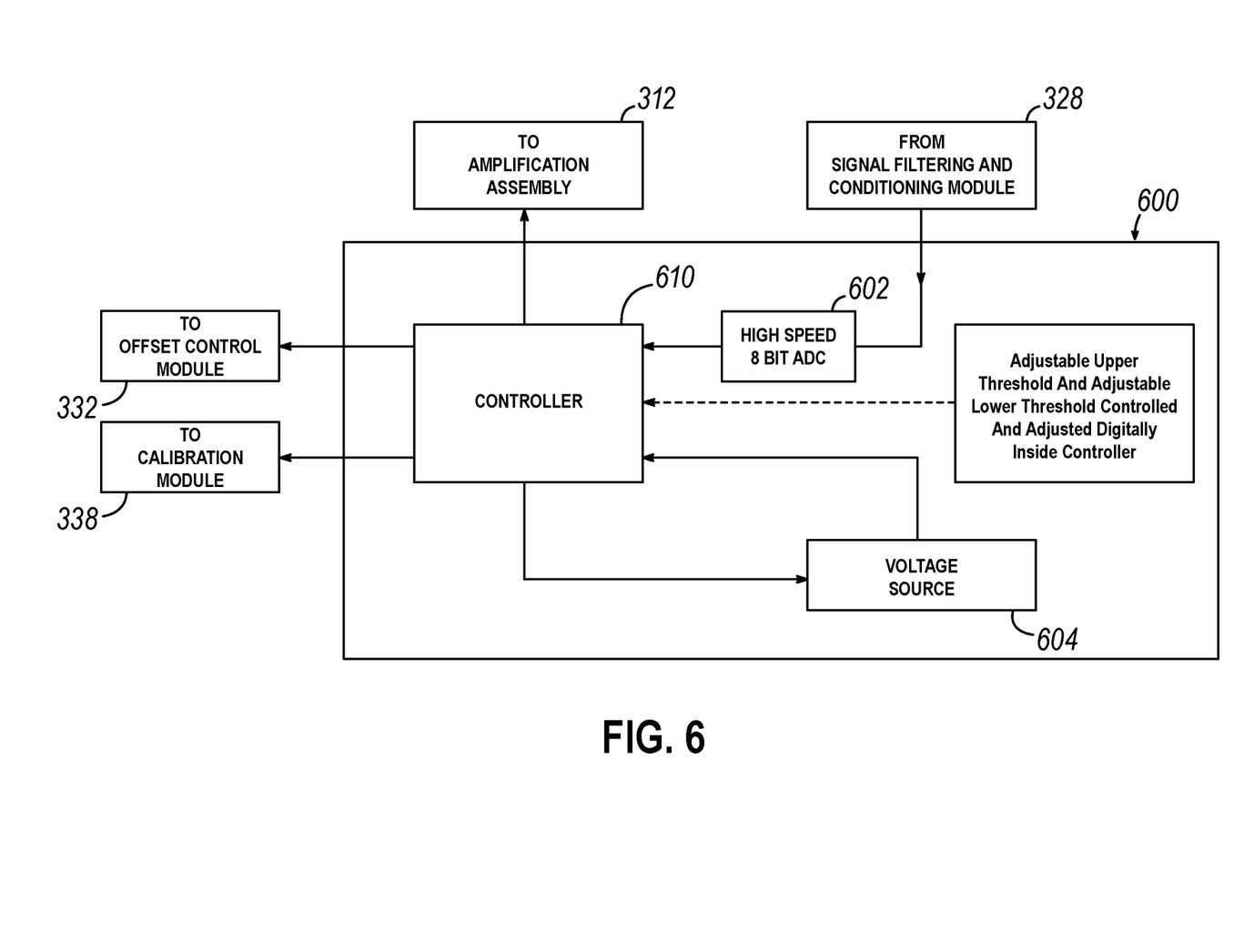
FIG. 6 depicts a schematic representation of another exemplary signal control unit for use with the signal processing assembly of FIG. 3, the signal control unit configured for digital voltage output feedback.

FIG. 6 illustrates another example of a signal control unit 600, which may be utilized and operable to provide the functions of signal control unit 334 as described above. Specifically, signal control unit 600 provides as one example digital-based module for controlling one or more of amplification assembly 312, offset control module 332, and calibration module 338. Signal control unit 600 includes an ADC 602, such as a high-speed 8-bit ADC, configured receive output voltage V0 and supply an output to controller 610. Controller 610 is configured to generate an adjustable upper voltage threshold and lower voltage threshold via voltage source 604, voltage source 604 of which may be controlled and adjusted by controller 610. Further, controller 610 is configured to digitally compare output voltage V0 with the upper and lower range voltage reference signals and determine whether output voltage V0 is within a predetermined input current signal range threshold. Thereafter, controller 610 may selectively control one or more of amplification assembly 312, offset control module 332, and calibration module 338 as described herein. As such, controller 610 can include a field-programmable gate array, a central microcontroller module or the like, along with an ADC and adaptive switching control capabilities.

Figure 7:
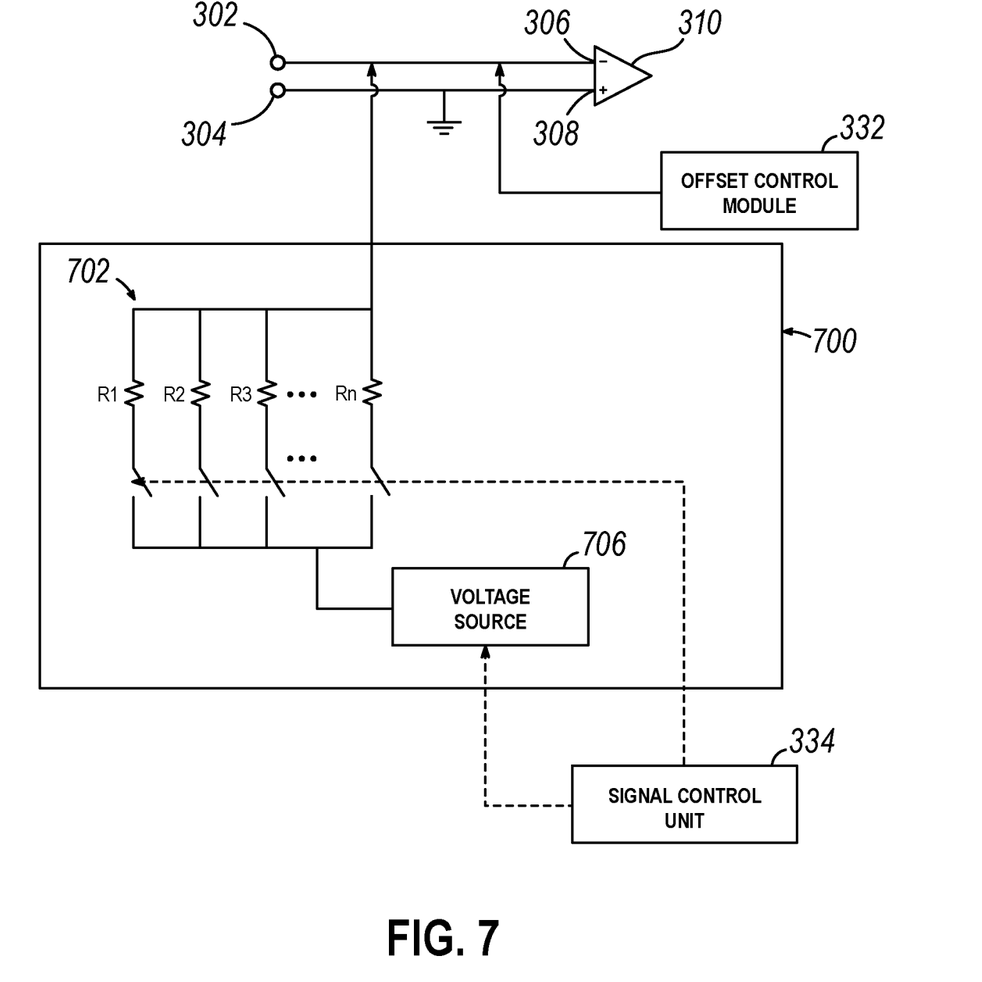
FIG. 7 depicts a schematic representation of an exemplary calibration module for use with the signal processing assembly of FIG. 3.

FIG. 7 illustrates an exemplary calibration module 700 which may optionally be utilized in place of calibration module 338. Calibration module 700 is configured to electrically couple to input nodes 306, 308 of amplifier 310, and is further configured to be operated with node 302 disengaged from electron multiplying element 130 or otherwise deactivated to calibrate signal processing assembly 300 prior to use. Specifically, calibration module 700 includes a reference current generator assembly 702 which couples with node 306 of amplifier 310. The reference current generator assembly 702 is coupled with a voltage source 706 and includes one or more resistors and switches, each switch selectively operable to vary the respective circuit resistance of the reference current generator assembly 702. In operation, with the input current at node 302 deactivated, signal control unit 334 may apply a voltage through reference current generator assembly 702 while selectively varying the resistance of the reference current generator assembly 702 to create an input current imbalance between nodes 306, 308, where node 308 is electrically grounded. Thereafter, signal control unit 334 may control offset control module 332 as required to insure an adequate offset current is applied to node 308 to reduce the input current imbalance between nodes 306, 308, effectively simulating corrective action to reduce the magnitude of the input current applied to nodes 306, 308 to bring the input current within the preferred dynamic range of amplifier 310. Signal control unit 334 may continue to vary the output of voltage source 706 and the resistance of reference current generator assembly 702 to insure signal processing assembly 300 continually adjust appropriately to offset the input currents applied.

Figure 8:
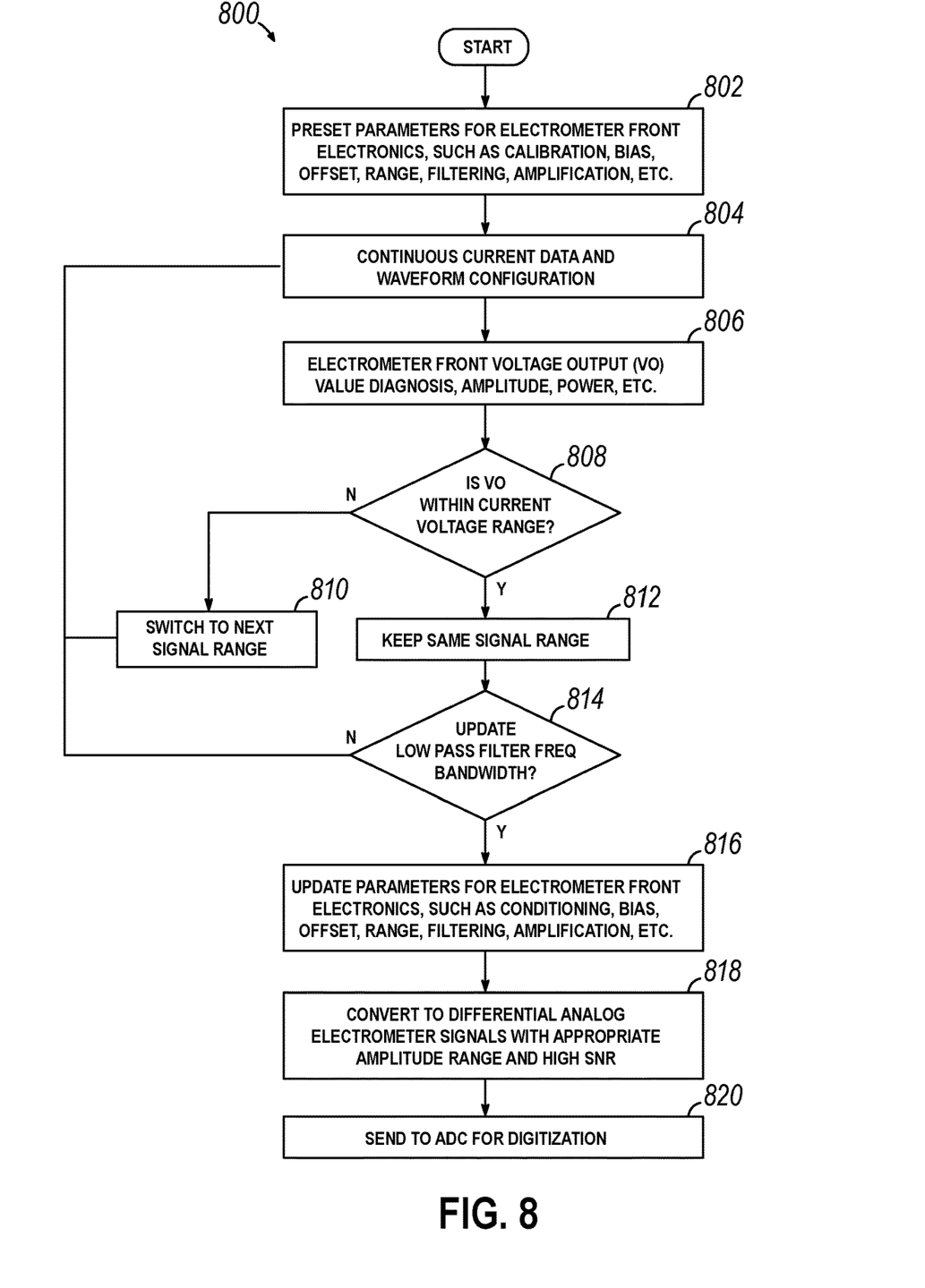
FIG. 8 depicts a flow chart of an exemplary method of adaptive control of the electrometer of a detector.

FIG. 8 provides an exemplary method 800 of adaptive control of the electrometer of a detector. At the commencement of method 800, step 802, a user or automation routine is configured to preset the parameters for the front-end electronics, such as processing assembly 300. Presetting the parameters for processing assembling 300 may include one or more of determining or predefining a preferred dynamic input range based upon the capabilities of amplifier 310 and/or ADC 330, initiating a calibration routine via calibration module 338, applying an offset current to amplifier 310 via offset control module 332, activating or setting the initial parameters of signal filtering and conditioning module 328, or setting the initial parameters of amplification assembly 312. Once the parameters of processing assembly 300 have been preset, at step 804, the ion source may be activated and processing assembly 300 enabled to continuously receive the resulting current input data. At step 806, amplifier 310 is configured to provide output voltage V0 for signal analyzer 336 to process. As described above, signal analyzer 336 may be configured to measure, for example, peak-to-peak voltage, RMS, or other signal characteristics, and to provide such analysis to signal control unit 334. At step 808, signal control unit 334 is configured to receive the signal processing data from signal analyzer 336 and determine whether the input current is within the preferred dynamic range. As will be described below, various methods may be utilized to determine whether the input current is within the preferred dynamic range and automatically adjust the input offset current in response to that determination. In the methods described below, reference to voltage ranges refer to output signal V0, and generally correlates with the respective rows of analog currents of table 400. A user may pre-determine the various range thresholds for switching the input offset.

In a first example, signal control unit 334 analyzes the analog current voltage signal amplitude, magnitude, or other similar signal characteristic (such as RMS, peak-to-peak, means, etc.). If the analog voltage V0 is less than 5% of the maximum of a particular current voltage range, the input offset is moved to the next lower range. Similarly, if the analog voltage V0 is greater than 95% of the maximum of the current voltage range, the input offset is moved to the next higher range.

In a second example, signal control unit 334 samples two voltage points Vp1 and Vp2 and analyzes the changing rate or trend of the signal (Vp1-Vp2) to predict a range where a future voltage point value may land. If the slope or trend rate is smaller than the slope or trend rate of the immediately preceding slope or trend rate, it can be predicted that future voltage points will not deviate significantly away from the existing range, therefore the input offset is kept in the same range. However, if the slope or trend rate is much larger than the slope or trend rate of the immediately preceding slope or trend rate, it can be predicted that future voltage points may deviate significantly away from the existing range and the input offset is accordingly moved to the next range.

In a third example, signal control unit 334 includes software algorithms to continuously adjust the input offset to obtain the best linearity and resolution of ADC 330. Further, in this example, an infinite number of small ranges may be deployed to essentially receive and react to adjust the input offset in real-time. For example, 0 to 3 microamps can be pre-determined as the first range, 3 to 10 microamps the second range, and so on. The range categorization and resolution may be adjusted which results in a stable and reliable electrometer signal acquisition and digitalization with improved signal to noise ratio. However, it should be understood that various other methods have been contemplated, such as using nonlinear methods (for example, ANN, fuzzy, etc.) to do predictive or trend diagnosis of the signal amplitude and power to achieve automatic and adaptive signal range switching in order to get the best quality electrometer signal with minimal errors.

As such, as described above, the method may either proceed to step 811 and keep the same signal range, or alternative move to step 810 and switch to the next, more accurate signal range using any of the example methods described. If the same signal range is kept, at step 811, the method continues to step 814, where it is determined whether to update the low pass filter's frequency bandwidth based upon the analysis of the received analog signal. If the low pass filter's frequency bandwidth is updated, the method moves to step 816 where it updates the parameters for the electrometer's front-end electronics, such as conditioning, bias-offset, filtering, amplification, or any other parameters as described above and would be understood in the art. Next, at step 818, the system converts the signal to a differential analog electrometer signal having an appropriate amplitude range and a high signal-to-noise ratio, before passing the signal to the ADC for digitization at step 820.

It is to be understood that features described with regard to the various embodiments herein may be mixed and matched in any combination without departing from the spirit and scope of the disclosure. Although different selected embodiments have been illustrated and described in detail, it is to be appreciated that they are exemplary, and that a variety of substitutions and alterations are possible without departing from the spirit and scope of the present disclosure.

What is claimed is:

1. A signal processing assembly for a detector, comprising:
   a signal amplifier configured to receive an input signal from the detector assembly and to provide an output signal;
   a control unit configured to compare a first data point from the output signal with a signal range, wherein the control unit is configured to generate an input bias control signal based upon the comparison; and
   an offset control module coupled with the control unit and configured to receive the input bias control signal, wherein the offset control module includes a power supply operatively coupled with an input of the signal amplifier, wherein the offset control module is configured to generate and apply an adaptive input offset signal at the input of the signal amplifier based upon the input bias control signal.

2. The signal processing assembly of claim 1, wherein the control unit is configured to continuously sample the output signal at a sampling frequency, wherein the sampling frequency ranges from approximately 100 Hz to approximately 10 GHz.

3. The signal processing assembly of claim 1, wherein the signal range includes an upper voltage level that range from approximately 1 volts to approximately 150 volts.

4. The signal processing assembly of claim 1 wherein the signal range includes a lower voltage level that ranges from approximately 10 microvolts to approximately 1 volts.

5. The signal processing assembly of claim 1, wherein the signal amplifier further includes a gain control, wherein the gain control is selectively operable to adjust a magnitude of a voltage component defined by the input signal.

6. The signal processing assembly of claim 1, further comprising:
   an ion detector assembly coupled with the input of the signal amplifier, wherein the ion detector assembly is configured to detect one or more ions to generate the input signal.

7. The signal processing assembly of claim 1, wherein the input signal defines a current amplitude that ranges from approximately 1 picoamperes to approximately 10 milliamperes.

8. The signal processing assembly of claim 1, wherein the output signal includes an analog signal, signal processing assembly further comprising:
   a converting means for converting the output signal to a digital signal.

9. The signal processing assembly of claim 1, wherein the adaptive input offset signal can be varied from a first to a second input offset signal in less than 1 microseconds.

10. The signal processing assembly of claim 1, wherein the power supply is selectively operable by the control unit to adjust the adaptive input offset signal.

11. A method of adapting an output signal range of a signal processing assembly of a measurement apparatus, comprising:
    generating a signal in response to particles detected during a scan;
    acquiring a first data point from the generated signal;
    determining if the first data point is within a threshold signal range; and
    when the first data point that is near, at, or outside of the threshold signal range, adjusting an input offset to thereby adjust a magnitude of the generated signal relative to a magnitude of the particles detected during the scan.

12. The method of claim 11, wherein a control unit is configured to continuously sample the signal at a sampling frequency, wherein the sampling frequency ranges from approximately 100 Hz to approximately 10 GHz.

13. The method of claim 11, wherein the threshold signal range includes an upper voltage level that range from approximately 1 volts to approximately 150 volts.

14. The method of claim 11 wherein the threshold signal range includes a lower voltage level that ranges from approximately 10 microvolts to approximately 1 volts.

15. The method of claim 11, wherein the particles detected during a scan defines an input signal with a current amplitude that ranges from approximately 1 picoamperes to approximately 10 milliamperes.

16. The signal processing assembly of claim 11 further comprising converting the output signal to a digital signal.

17. A signal processing assembly, comprising:
    an ion detector assembly configured to detect one or more ions to generate an input signal;
    a signal amplifier configured to receive the input signal from the ion detector and to provide an output signal;
    a control unit configured to compare a first data point from the output signal with a signal range, wherein the control unit is configured to generate an input offset command based upon the comparison; and
    an offset control module coupled with the control unit and configured to receive the input offset command, wherein the input offset command includes at least one of a first command to increase an input offset bias signal for application to the input of the signal amplifier, or a second command to decrease the input offset bias signal for application to the input of the signal amplifier, wherein the offset control module is configured to adjust the input offset bias signal applied at the input of the signal amplifier based upon the receiving of the at least one of the first command or the second command.

18. The signal processing assembly of claim 17, wherein the output signal includes an analog signal, the signal processing assembly further comprising:
   a converting means for converting the output signal to a digital signal.

19. The signal processing assembly of claim 17, wherein the signal amplifier further includes a gain control, wherein the gain control is selectively operable to adjust a magnitude of a voltage component defined by the input signal.

20. The signal processing assembly of claim 17, further comprising:
   a power supply operatively coupled with the input of the signal amplifier and the offset control module, wherein the power supply is selectively adjustable to adjust the input offset bias signal.

* * * * *

UNITED STATES PATENT AND TRADEMARK OFFICE
CERTIFICATE OF CORRECTION

PATENT NO. : 11,469,088 B2
APPLICATION NO. : 17/074527
DATED : October 11, 2022
INVENTOR(S) : Hongxuan Zhang It is certified that error appears in the above-identified patent and that said Letters Patent is hereby corrected as shown below:

In the Claims

In Column 11, Claim 3, Line 59, delete "range from" and insert -- ranges from --, therefor.

In Column 11, Claim 3, Line 60, delete "1 volts" and insert -- 1 volt --, therefor.

In Column 11, Claim 4, Line 61, delete "claim 1" and insert -- claim 1, --, therefor.

In Column 11, Claim 4, Line 63, delete "1 volts." and insert -- 1 volt. --, therefor.

In Column 12, Claim 7, Line 9, delete "1 picoamperes" and insert -- 1 picoampere --, therefor.

In Column 12, Claim 9, Line 18, delete "1 microseconds." and insert -- 1 microsecond. --, therefor.

In Column 12, Claim 13, Line 40, delete "range from" and insert -- ranges from --, therefor.

In Column 12, Claim 13, Line 41, delete "1 volts" and insert -- 1 volt --, therefor.

In Column 12, Claim 14, Line 42, delete "claim 11" and insert -- claim 11, --, therefor.

In Column 12, Claim 14, Line 44, delete "1 volts." and insert -- 1 volt. --, therefor.

In Column 12, Claim 15, Line 47, delete "1 picoamperes" and insert -- 1 picoampere --, therefor.

In Column 12, Claim 16, Line 49, delete "The signal processing assembly of claim 11" and insert -- The method of claim 11, --, therefor.

Signed and Sealed this
Twenty-second Day of November, 2022

Katherine Kelly Vidal
*Director of the United States Patent and Trademark Office*